United States Patent [19]
Dent

[11] Patent Number: 5,694,433
[45] Date of Patent: Dec. 2, 1997

[54] EFFICIENT LINEAR POWER AMPLIFICATION

[75] Inventor: Paul W. Dent, Stehag, Sweden

[73] Assignee: Ericsson Inc., Research Triangle Park, N.C.

[21] Appl. No.: 305,729

[22] Filed: Sep. 14, 1994

[51] Int. Cl.$^6$ ..................................................... H04K 1/02
[52] U.S. Cl. .................. 375/297; 375/278; 375/284; 375/285; 375/298; 330/124 R; 330/151; 330/295; 455/63; 455/235.1; 332/103; 332/123; 332/159
[58] Field of Search .................... 375/226, 260, 375/261, 271, 272, 278, 284, 285, 296, 297, 298, 303, 334, 346, 348–350; 330/124 R, 126, 157, 127, 129, 149, 295; 455/63, 67.3, 115, 226.1, 235.1, 295, 296, 303, 311, 312; 332/100, 103, 123–125, 159, 160

[56] References Cited

U.S. PATENT DOCUMENTS

| | | | |
|---|---|---|---|
| 4,843,615 | 6/1989 | Davis | 375/324 |
| 5,121,412 | 6/1992 | Borth | 375/308 |
| 5,187,721 | 2/1993 | Wong | 375/303 |
| 5,436,749 | 7/1995 | Pidgeon, Jr. et al. | 375/296 |
| 5,481,389 | 1/1996 | Pidgeon et al. | 375/296 |

FOREIGN PATENT DOCUMENTS

| | | |
|---|---|---|
| 0 085 600 | 8/1983 | European Pat. Off. . |
| 0 441 110A1 | 8/1991 | European Pat. Off. . |
| 0 498 456A1 | 8/1992 | European Pat. Off. . |

OTHER PUBLICATIONS

Derek S. Hilborn, et al., "An Adaptive Direct Conversion Transmitter", IEEE Transactions on Vehicular Technology, vol. 43, No. 2, pp. 223–233, (May 1994), New York, US.

Primary Examiner—Stephen Chin
Assistant Examiner—Amanda T. Le
Attorney, Agent, or Firm—Burns, Doane, Swecker & Mathis, L.L.P.

[57] ABSTRACT

A method and apparatus for producing amplified signals for communications having reduced adjacent channel energy involving generating a first signal having an undesired amount of adjacent channel energy, generating a second signal corresponding to the undesired amount of adjacent channel energy, and subtracting the second signal from the first signal to remove the undesired amount of adjacent channel energy. Several embodiments are disclosed.

29 Claims, 5 Drawing Sheets

EFFICIENT LINEAR POWER AMPLIFICATION

BACKGROUND OF THE INVENTION

1. Field of the Invention

The present invention relates to a linear power amplifier and a method of linear amplification suitable for use in a transmitter, such as a Class-C CPFSK transmitter.

2. Discussion of Related Art

Signals used for radio communications fall into one of the following three categories: (i) pure amplitude modulation (AM); (ii) pure angle modulation or constant envelope signals such as frequency modulation (FM) or phase modulation (PM); or (iii) complex modulation which has both AM and FM components, such as single sideband (SSB).

The abbreviations AM, FM and SSB refer historically to modulation of radio waves with analog speech waveforms. More recently, modulation with digital data signals has assumed greater importance. Digitally modulated signals occupy a wide bandwidth unless means are employed to contain the transmitted spectrum. On one hand, there are limits to how well the spectrum can be contained using constant envelope modulation for data signals. On the other hand, the use of non-constant envelope modulation requires a linear transmitter power amplifier which preserves both the amplitude and phase of the signals it amplifies and these devices are less efficient than constant envelope power amplifiers.

Prior art recognizes a number of classes of power amplifier depending on the type of signal that is to be amplified.

Class-A amplifiers conduct signal current throughout the cycle of the signal waveform and are the most linear amplifiers. Class-A amplifiers are suitable for signals that can vary in amplitude, and their power consumption from the supply (e.g., battery) is a constant irrespective of the signal level, at least so long as the signal level does not exceed the maximum power capability or saturation point. Class-A amplifiers are wasteful of power during moments when a varying amplitude signal is below the saturated power output level. This aspect is improved upon in Class-B amplifiers.

Class-B amplifiers conduct signal current exactly for one-half of the cycle of the input signal waveform. In a push-pull Class-B amplifier one device conducts for one half-cycle, and the other device conducts for the remaining half-cycle. Class-B amplifiers consume a varying amount of current from the supply proportional to the square root of the momentary output power level. Although Class-B amplifiers consume no current when not delivering output power and their efficiency at intermediate power levels between zero and saturation is better than Class-A amplifiers, Class-B amplifier's efficiency is nevertheless lower at lower output powers than at saturation, so that the mean efficiency with varying amplitude signals is less than the maximum efficiency at saturated output power.

Class-C amplifiers conduct for less than one half of a complete signal cycle and are used primarily as radio-frequency amplifiers with the load tuned to the signal frequency. Class-C amplifiers are suitable only for constant envelope signals, and operate at full saturation efficiency the whole time. If it is attempted to amplify non-constant envelope signals with a Class-C power amplifier, the signal envelope fluctuations will not be faithfully reproduced, but will be clipped off or distorted.

Prior art also encompasses various circuit configurations used to improve the linearity of Class-B and Class-C amplifiers, and these can be broadly categorized as feedback, feedforward, or envelope re-modulation.

As an example of feedback techniques, amplifiers have been built in which an amplitude detector senses the output amplitude and compares it with the desired amplitude of the input signal. The error is used to generate a feedback signal that increases or decreases the power amplifier gain, or alters the bias or some other parameter in a direction which will correct the amplitude.

Feedback techniques have also been described in the prior art in which both amplitude and phase feedback are employed, the latter also eliminating a source of non-linearity known as AM to PM conversion.

Feedback techniques are known in which neither the amplitude and phase angle but rather complex vector components are sensed, compared to what they should be, and two error signals generated and fed back to adjust the each component to the desired value. This is known as Cartesian loop feedback whereas the amplitude and phase feedback technique is known as a polar loop.

Feedforward techniques known to the art include subtracting a proportion of the power amplifier output signal from a proportion of the input signal to obtain an error signal, amplifying the error signal, and then subtracting the error signal from the power amplifier output signal. This is normally only technically advantageous when the error signal is already small at the power amplifier output, i.e., when the amplifier is already substantially linear.

Non-linearity is often measured by a so-called two-tone test, where two signals close together in frequency f1 and f2 are added to produce a non-constant envelope test signal. Non-linearity shows up in the appearance of other frequencies in the power amplifier output particularly at 2f1−f2 and 2f2−f1, known as third order intermodulation products. Typically a good linear power amplifier will achieve intermodulation levels 30 to 35 dB below the test tone levels without the above-mentioned circuit configurations, while feedforward can increase this performance to 60 dB below the test tone levels.

Also belonging to the class of feedforward techniques is a technique known as predistortion, in which the power amplifier is driven with a modified input signal precalculated to produce the desired output signal, using knowledge of the non-linear input-output transfer function.

Envelope re-modulation can be used with a Class-C power amplifier to restore the amplitude variations that the Class-C power amplifier does not normally reproduce. The most efficient form of envelope remodulation is to vary the power supply voltage to the power amplifier. This is known as high-level amplitude modulation (AM), and is most efficiently accomplished by means of pulse width modulation. However, all forms of high-level AM require the use of bulky components.

CPFSK (Continuous-Phase, Frequency-Shift Keying) is a constant envelope modulation, i.e., a pure phase modulation which the phase trajectories are heavily smoothed to control adjacent channel energy. The advantage of CPFSK is that it can be amplified using a Class-C transmit power amplifier.

Unfortunately, a constant envelope signal does not achieve a sufficient compromise between adjacent channel and communication efficiency for digital land mobile radio (DLMR) such as used in cellular telephone systems.

Adjacent channel energy can be reduced by filtering the CPFSK signal in the I, Q domain, which is equivalent to RF band pass filtering. However, this introduces amplitude modulation and a Class-C power amplifier can no longer be used.

In U.S. patent application Ser. No. 08/179,947 naming as inventors Dent and Lampe and filed Jan. 11, 1994, now U.S. Pat. No. 5,574,967 it is disclosed that two Class-C power amplifiers can be driven with different CPFSK signals and combined in such a way that the desired amplitude variations can be created. The present invention comprises power amplifiers of unequal power that may be combined to substantially reduce adjacent channel energy produced by the larger amplifier operating with constant envelope modulation.

SUMMARY OF THE INVENTION

The present invention avoids a disadvantage of the prior Dent-Lampe invention which generates two signals of increased adjacent channel energy, which when combined should give reduced adjacent channel energy. Instead, the present invention generates one signal of normal adjacent channel energy and a compensation signal of lower power having only the same power-to-adjacent channel energy. The present invention is based on combining a Class-C power amplifier signal with a very much lower linear power amplifier signal.

The invention described herein is a method of obtaining spectral containment benefits of non-constant envelope modulation, while achieving substantially the transmitter power amplifier efficiency of constant envelope modulation.

The present invention belongs to the class of feedforward techniques, but is not limited to the case where the power amplifier is already substantially linear. It is not conceived for making an already linear power amplifier even better, but rather as a means of using a high-efficiency Class-C power amplifier to produce bandwidth-contained signals.

Specifically, the present invention involves a method and apparatus for producing amplified signals for communications having reduced adjacent channel energy involving generating a first signal having an undesired amount of adjacent channel energy, generating a second signal corresponding to the undesired amount of adjacent channel energy, and subtracting the second signal from the first signal to remove the undesired amount of adjacent channel energy.

In an alternative embodiment, the present invention involves a method and apparatus for amplifying communications signals exhibiting reduced adjacent channel energy including generating I, Q modulation signals wherein a sum of the squares of instantaneous I and Q signals is a constant, applying the I, Q signals to a quadrature modulator operating on sine and cosine carrier frequency signals to obtain a constant-envelope signal, amplifying the constant envelope signal using a power amplifier designed to yield high efficiency with constant-envelope signals, high-pass filtering the I and Q signals and applying the high-pass filtered signals to a second quadrature modulator to obtain an error signal, amplifying the error signal using a linear amplifier adapted to effectively amplify varying amplitude signals, and adding an output of the power amplifier to an output of the linear amplifier in order to obtain a signal having reduced adjacent channel energy.

In yet another embodiment, the present invention involves a method and apparatus for producing digital data signals exhibiting reduced adjacent channel energy including generating I, Q modulated signals representing digital data, the signals having greater than desired adjacent channel energy, applying the I, Q signals to a quadrature modulator operating on sine and cosine carrier frequency signals to obtain a first signal, high-pass filtering the I, Q modulation signals to obtain high-pass filtered I, Q signals, applying the high-pass filtered I, Q signals to a second quadrature modulator to obtain a second signal, and amplifying and adding the first and second signals to obtain a signal having reduced adjacent channel energy.

In a further alternative embodiment, the present invention involves a method and apparatus for amplifying digital data signals exhibiting reduced adjacent channel energy including feeding digital data signals through a shift register of N stages, coupling N signals from the shift register corresponding to the last N data bits of the digital data signals to address input lines of a read only memory, connecting address lines of the read only memory to the digit lines of a counter, incrementing the counter to obtain sequentially a number of sets of four output values from the read only memory, digital-to-analog converting the four output values to obtain a first I, Q signal and a second I, Q signal, applying the first I, Q signal to a first quadrature modulator to obtain a first signal of higher than desired adjacent channel energy, applying the second I, Q signal to a second quadrature modulator to obtain a second signal, and amplifying and adding the first signal to the second signal in an optimum ratio to obtain a signal of reduced adjacent channel energy.

BRIEF DESCRIPTION OF THE DRAWINGS

The invention will now be described with reference to the accompanying drawings in which.

DETAILED DESCRIPTION OF THE PREFERRED EMBODIMENTS

Figure 1:
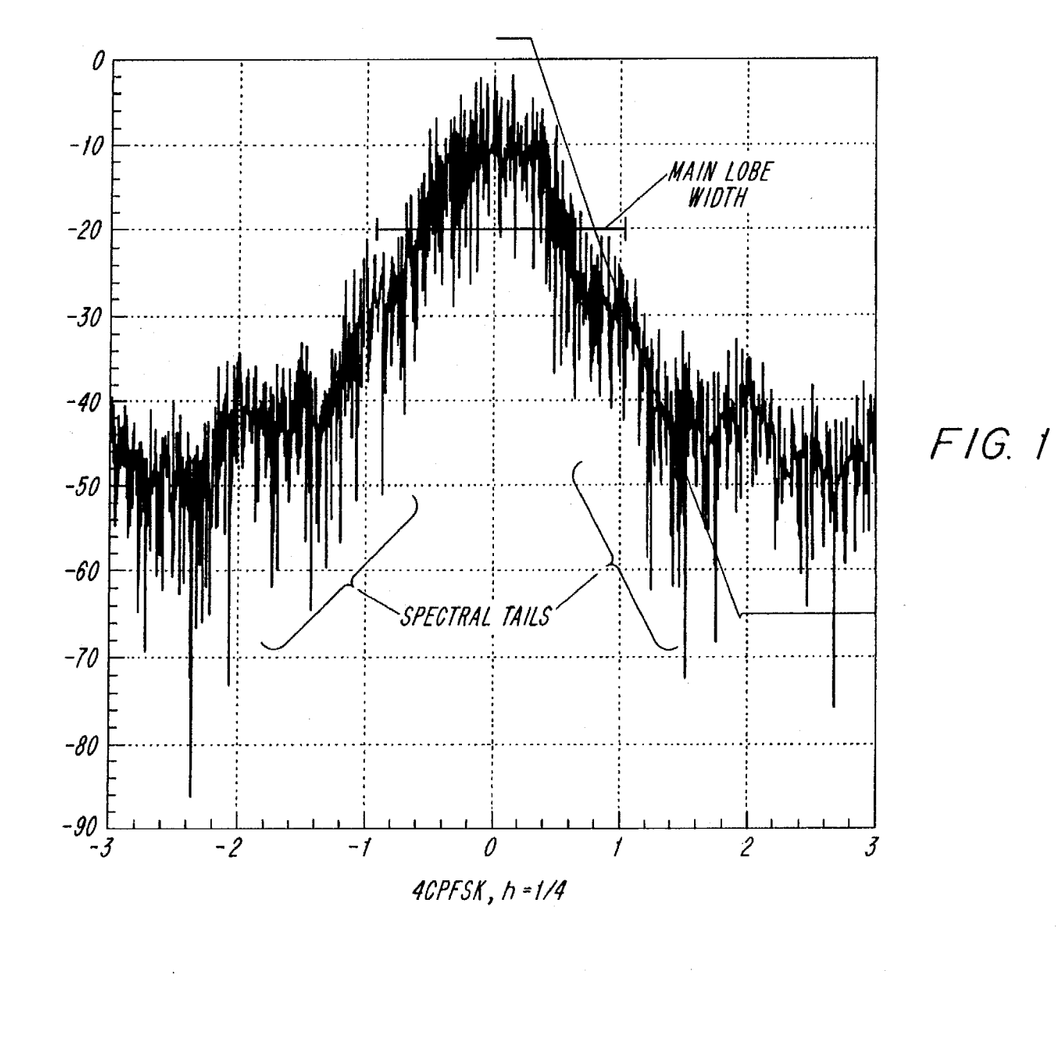
FIG. 1 is a graph of a typical spectrum of a radio signal with digital data in a constant envelope.

FIG. 1 shows the typical spectrum of a radio signal modulated with digital data in a constant envelope fashion, such as can be handled by an efficient Class-C power amplifier. The spectrum consists of a main lobe containing the wanted signal energy, but has attendant "tails" or "skirts" of energy reaching into neighboring channels. These cause the undesired phenomenon of adjacent channel interference. It is unnecessary to transmit the energy in the spectral tails, as they lie outside the pass bandwidth of the intended receiver. Therefore, if they could be omitted, the intended receiver would not know the difference. Unintentional receivers tuned to the adjacent radio channels would however benefit from the removal of this source of interference, which is a main objective of the present invention.

The interference energy in the tails represents only a small fraction of the total energy and could in principle be removed using a bandpass filter after the power amplifier. Unfortunately, bandpass filters of narrow bandwidth at a RF output frequency are generally impracticable. On the other hand, a bandpass filter equivalent can be formed at low power levels by generating the desired signal using a so-called quadrature modulator. This quadrature modulator which can be constructed according to U.S. patent application Ser. No. 07/967,027, naming the present inventor and B. Ekelund, filed Oct. 27, 1992, and its CIP application, U.S. patent application Ser. No. 08/305,702, now U.S. Pat. No. 5,530,722, naming the present inventor and filed on a date even herewith entitled "Quadrature Modulator with Integrated Distributed RC Filters" (Attorney Docket No. 027540-287), decomposes the desired signal into a sine and cosine waves of varying amplitudes, indicated by the waveforms I(t) and Q(t).

It is well-known that low pass filtering the I and Q signals is equivalent to bandpass filtering the RF output signal, producing a contained spectrum with low tail energy. However, a signal so-generated is not guaranteed to be a constant envelope signal, which requires that I squared plus Q squared be a constant ($I^2+Q^2=C$). A signal not conforming to this would not be faithfully reproduced by a Class-C amplifier.

Generally, I, Q waveforms are created for digital transmitters whether of a CPFSK type (e.g., GSM type) or otherwise (e.g., U.S. IS-54 digital cellular type) by means of a so-called ROM modulator. The ROM modulator relies on being able to truncate the impulse response of the premodulation filter to a reasonable number of bit periods, N, where $2^N$ gives a ROM of a reasonable size. Using the truncated impulse response, the filter can produce, over each bit interval, one of a finite number, $2^N$, of possible waveforms. By storing each I, Q waveform at an adequate number of samples per bit in a ROM, the modulation and filtering is achieved simply by feeding the data stream through an N-bit shift register which addresses the ROM to output waveforms for that bit interval.

The present invention is based in part on the following premise: a second I, Q waveform can be generated by a second ROM modulator of the same impulse response length N as the first modulator, but which has the spectrum only of the adjacent channel energy which is to be eliminated. The present invention is based on the proposition that a very low power, linear power amplifier can be used to amplify the second signal, which would then be added to the original constant envelope signal produced by an efficient Class-C power amplifier. Since the adjacent power channel energy of the original waveform is perhaps already 40 dB down, the linear power amplifier would be 20 dB below the main power amplifier and added via a −20 dB coupler. For a 3 watt main power amplifier, the linear power amplifier would be only 30 milliwatts average power.

Figure 2:
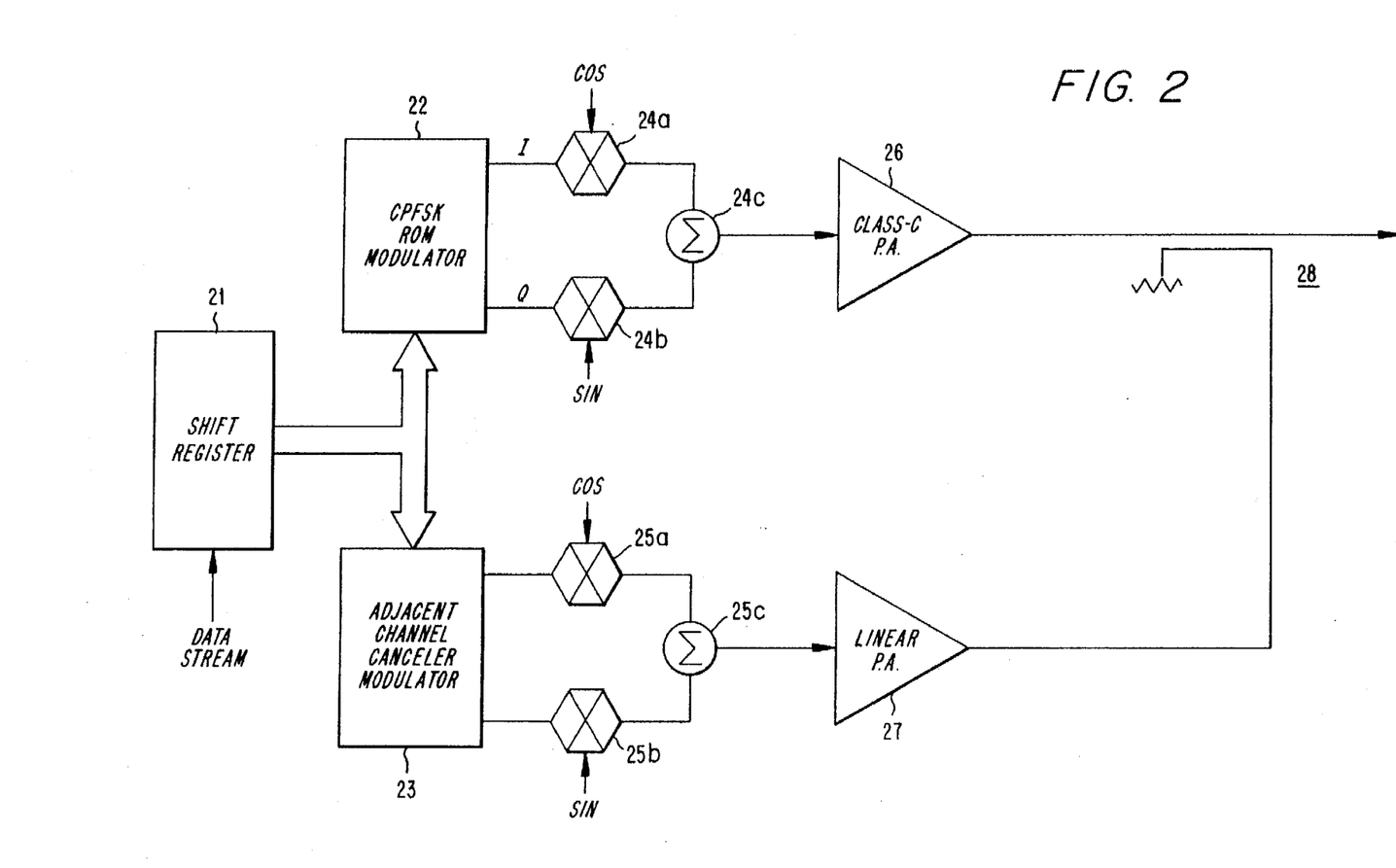
FIG. 2 is a schematic of an adjacent channel energy canceling circuit, in accordance with the present invention.

With reference to FIG. 2, a digital data stream is input to an N-bit shift register 21 the contents of which are input in parallel to a CPFSK ROM modulator 22 and an adjacent channel canceler ROM modulator 23. The bits in the digital data stream act as addresses in the ROM modulators 22 and 23, the output of which are I and Q signals which correspond to the input data including skins and the skins per se.

The I and Q outputs of the CPFSK ROM modulator 22 and the adjacent channel canceler ROM modulator 23 are input to quadrature modulators 24 and 25, each having respective sine and cosine mixers 24a, 24b, 25a, 25b the outputs of which are inputs to respective summation devices 24c and 25c. The output of the first summation device 24c associated with the CPFSK ROM modulator 22 is input to a Class-C power amplifier 26, while the output of the summation device 25c associated with the adjacent channel canceler ROM modulator 23 is input to a linear power amplifier 27.

The Class-C power amplifier 26 has a relative power of $P_1$ equal to approximately 3 watts, for example. The relative power output of the linear power amplifier 27 is $P_1$−A/2 dBw, for example, 30 milliwatts, wherein A is the number of dB the adjacent channel energy is below $P_1$.

The output of the linear power amplifier 27 is then coupled to the output of the Class-C power amplifier 26 by a coupler 28, having a relative transfer power ratio−A/2 dB, for example, −20 dB.

Figure 3:
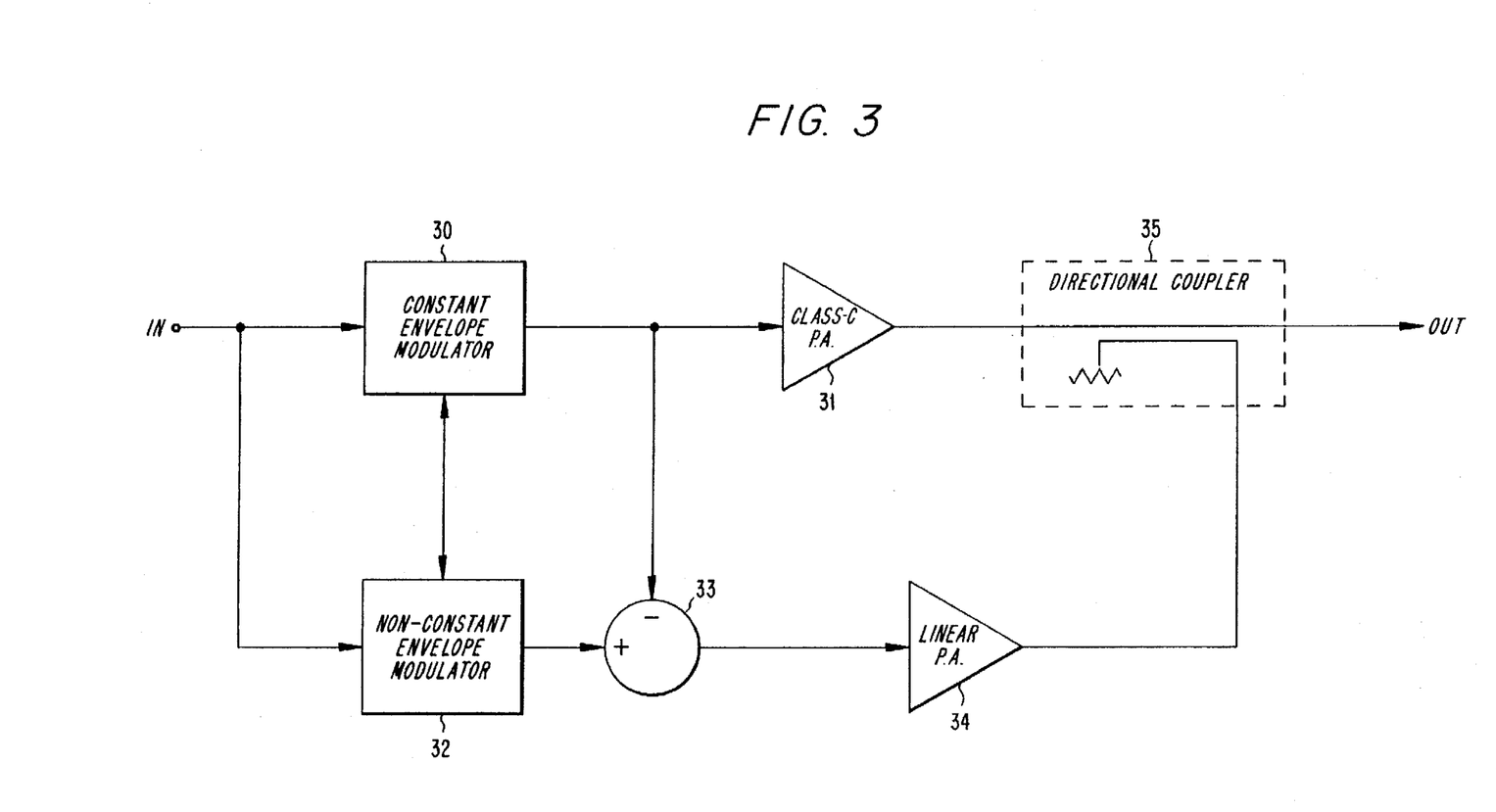
FIG. 3 is a schematic of a power amplification circuit for amplification of non-constant envelope modulated signals, in accordance with the present invention.

An alternative embodiment is depicted in FIG. 3, wherein a constant amplitude signal is initially generated from an input digital data stream or modulating waveform using, e.g., an I, Q modulator 30, and amplifies the constant amplitude signal with a Class-C power amplifier 31. The I, Q modulator may be configured as disclosed in U.S. patent application Ser. No. 07/967,027, naming the present inventor and B. Ekelund, filed Oct. 27, 1992, and its CIP application, U.S. patent application Ser. No. 08/505,702, now U.S. Pat. No. 5,530,722, naming the present inventor and filed on a date even herewith entitled "Quadrature Modulator with Integrated Distributed RC Filters" (Attorney Docket No. 027540-287). Then, on a parallel line, a corresponding non-constant amplitude signal is produced from the input data stream in a second I, Q modulator 32 having the low energy spectral tails. The non-constant envelope modulator separates out the spectral tails from the rest of the input signal by means of the ROM modulator 23 (FIG. 2) or by means of a low pass filter. The constant envelope modulator 30 and the non-constant envelope modulator 32 are each supplied a carrier frequency from a common source (not shown). The difference between the spectrally contained signal from the I, Q modulator 32 and the constant envelope signal from the power amplifier 31 is then formed in a signal subtractor 33.

The difference signal from the subtractor 33 is a non-constant amplitude signal which is amplified using a linear power amplifier 34. The amplified difference signal from the linear amplifier 34 is added to the Class-C power amplifier 31 output using a directional coupler 35 to cancel the undesired spectral tails.

In this technique the error signal consists only of low energy spectral tails and thus requires only a very low power linear power amplifier to scale them to the output signal level.

It is well known that no adding device such as such as the directional coupler 35 can add signals of the same frequency without some loss. However, the loss can be minimized by choosing the coupling ratio to be of the order of the square root of the ratio of the power levels of the main Class-C power amplifier 31 and the error amplifier 34 peak power level. For example, if the Class-C power amplifier 31 is of 1 kilowatt, and the error amplifier 34 needs only to be of 1 watt by virtue of the spectral tail energy being more than 30 dB down, then a directional coupler 35 preferably has a loss of 0.3 dB to the main 1 kilowatt power amplifier, a −15 dB coupling ratio to the error amplifier 34, and accordingly the error amplifier 34 is increased in power level by 15 dB from 1 watt to 30 watts to compensate.

In this way, the lower power amplifier 34 is given the highest loss path and the higher power amplifier 31 is given the lowest loss path, minimizing the impact on overall efficiency of loss in the adding network 35.

A more refined version of the present invention will now be described with reference to FIG. 4.

The non-constant envelope signal may be produced by low-pass filtering the constant envelop I, Q signals and applying them to a second I, Q modulator. Since the difference of the output signal from this modulator and the first, constant amplitude modulator is required, this difference can be calculated at the I, Q signal points. Moreover, the difference between a signal and a low-pass filtered version of it is merely a high-pass filtered version.

Figure 4:
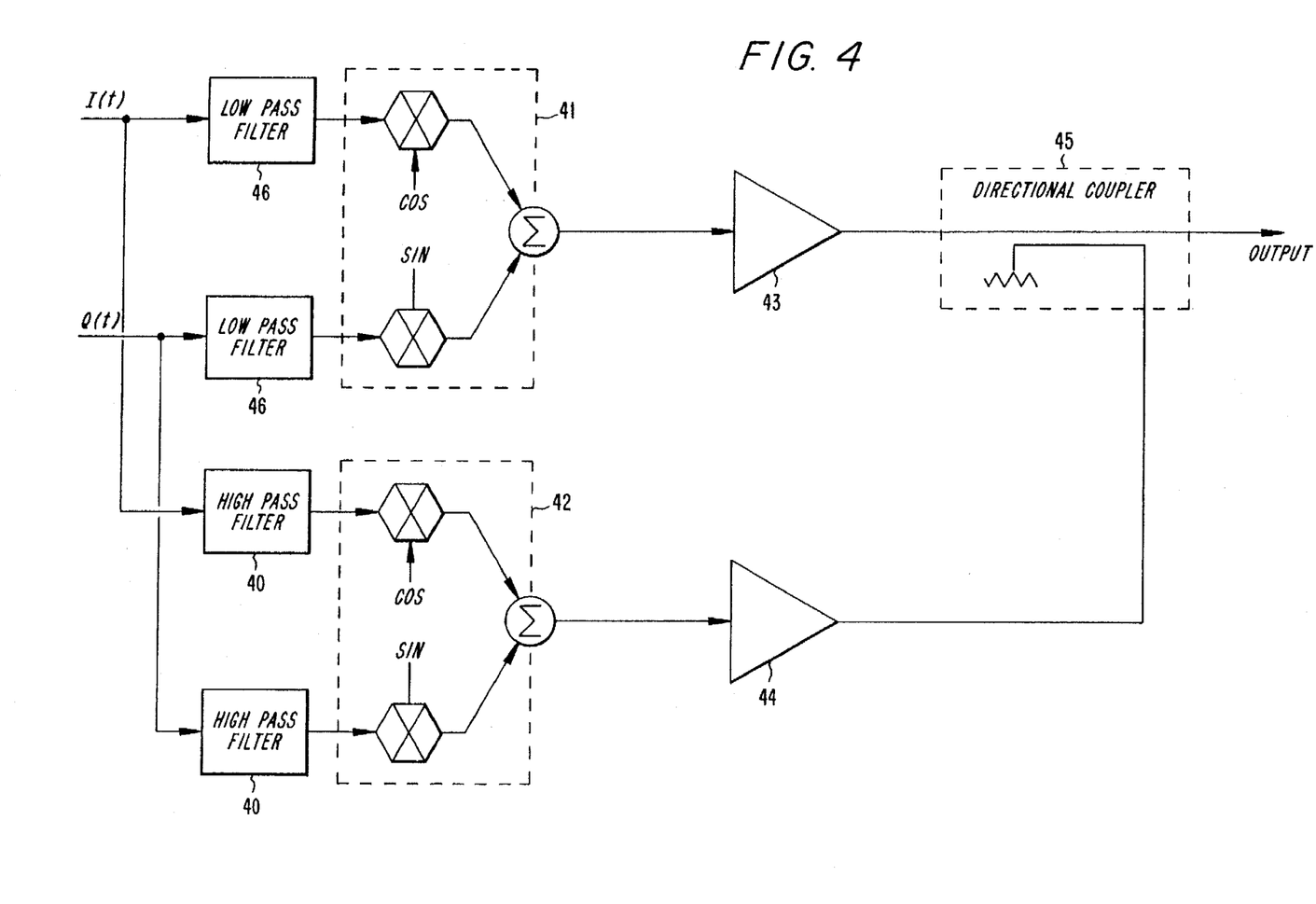
FIG. 4 is a schematic of a power amplification circuit including direct generation of the difference signal by high pass filtering, in accordance with the present invention.

Therefore, a preferred implementation shown in FIG. 4 forms the difference signal directly by high-pass filtering the I, Q signals using a pair of high pass filters 40 (one for each signal) and applying them to a second quadrature modulator 42. The difference signal is amplified as before in a linear error amplifier 44 and then added in a directional coupler 45 to the output of a constant envelope amplifier 43 which receives a constant envelope signal from a first quadrature modulator 41.

Optional low pass filters 46 may be included; both the upper filters 46 and lower filters 40 might, however, comprise digital-to-analog convertors if the I, Q signals originate in digital form.

In practice, the generation of constant envelope modulated data signals and/or linearly filtered data signals may be accomplished with the aid of a so-called ROM modulator. The ROM (Read Only Memory) modulator assumes that the filter used to shape the I, Q or phase angle transitions has a finite impulse response of a few data symbols (e.g., bits) duration. That means that each segment of I or Q waveform over a symbol period depends only on that finite number of bits. For example, if the filter impulse response is five bit periods long, there are only 32 ($2^5$) possibilities for the output waveform. Plus/minus and time reversal symmetries permit a compression of these waveform types so that all may be stored in a small ROM. Modulation and filtering are then combined in the operation of simply retrieving a waveform from a memory location given by the last five data bits.

An implementation of the present invention can be constructed where both the constant envelope modulation and the high-pass filtered version of it can be represented by finite impulse response filter functions. The finite number of I and Q waveforms which can arise are then stored in a ROM for both versions.

Figure 5:
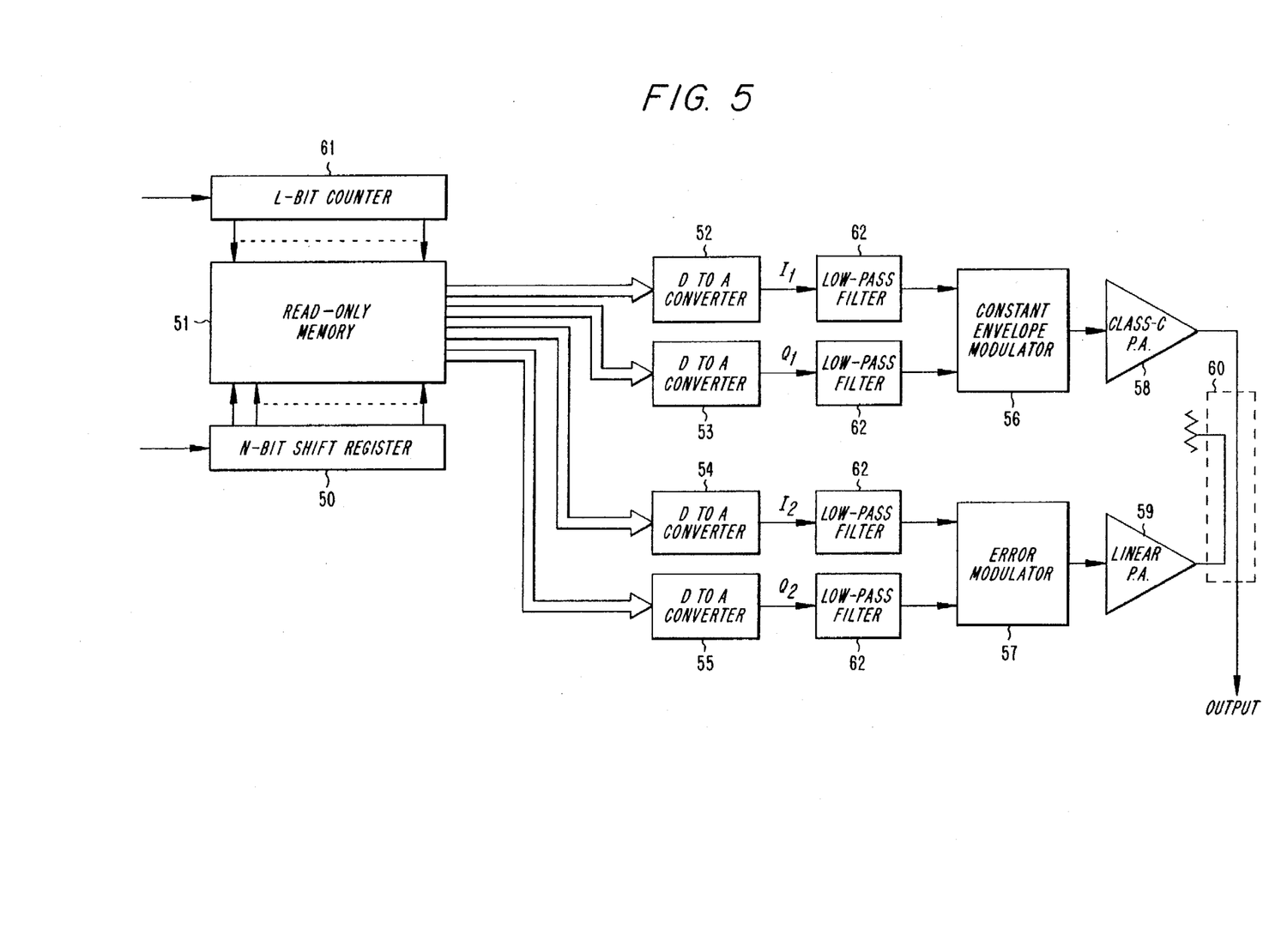
FIG. 5 is a schematic of an embodiment using a ROM modulator, in accordance with the present invention.

Referring to FIG. 5, every bit period a new bit is shifted into an N-bit shift register 50, and the last N bits, where N corresponds to the impulse response length of the filter, are presented to a ROM 51. Two I and two Q waveforms (corresponding respectively to the constant envelope waveform and the high-pass filtered waveform) are selected from the ROM and converted from digital to analog form in four digital-to-analog converters 52–55.

In response to a clock input, a counter 61 then steps M times during each bit period of the input digital data stream to produce a sequence of M points representing in discrete steps in the waveform over the bit period. The D-to-A converted waveforms are filtered in anti-aliasing low-pass filters 62 to remove the step granularity then presented respectively to a constant envelope modulator 56 and an error signal modulator 57, respectively. The constant envelope modulator output may be amplified by a Class-C power amplifier 58 while the error signal is amplified by a linear power amplifier 59. The outputs of the two power amplifiers are then added in a directional coupler 60.

It is pointed out that, to obtain best cancellation of the unwanted spectral components, it may be necessary to build in a relative delay of the constant envelope signal relative to the error signal to compensate for the inherent delay in the high-pass filtering operation. This can be accomplished in the implementation of FIG. 4 by digitally retiming the data stream by means of high-pass filters 40 used to produce the constant envelope I, Q signals using a suitable clock. If the high-pass filters 40 exhibit a delay, the filters 46 can delay the constant envelope signals to align them in time for correct cancellation of spectral energy tails. In the case of the ROM modulator, the relative delay can be built into the ROM contents.

Other embodiments of the present invention will be apparent to a person skilled in the art which differ in detail, but embodying the present invention's general principle of generating an amplified error signal corresponding to the unwanted spectral energy tails of a constant envelope signal, adding this signal to the constant envelope signal so as to cancel those unwanted spectral components, leaving a signal with greatly reduced adjacent channel energy.

While only particular embodiments of the present invention have been shown and described herein, it will be obvious that further modifications may be made without departing from the invention in its broader aspects. For example, various other implementations could be devised utilizing other hardware devices, digital signal processors, or memory configurations. Accordingly, the claims are intended to cover all such changes and alternative constructions that fall within the scope and spirit of the invention.

I claim:

1. A method for producing amplified signals for communications having reduced adjacent channel energy, said method comprising the steps of:
   generating a first signal having an undesired amount of adjacent channel energy;
   generating a second signal corresponding to the undesired amount of adjacent channel energy; and
   subtracting said second signal from said first signal to remove said undesired amount of adjacent channel energy.

2. A method according to claim 1 wherein said first signal is a constant-envelope signal.

3. A method according to claim 1 wherein said step of generating said first signal includes phase modulating a carrier frequency signal.

4. A method according to claim 3 wherein said phase modulating step includes quadrature modulation using sine and cosine carrier frequency signals.

5. A method according to claim 1 wherein said step of generating said first signal includes modulating a signal with digital data.

6. A method according to claim 1 further comprising the step of amplifying said first signal by a Class-C power amplifier.

7. A method according to claim 1 further comprising the step of amplifying said second signal by a linear amplifier.

8. A method according to claim 1 wherein said subtraction step includes combining in a directional coupler said first and second signals in a predetermined ratio.

9. A method for amplifying communications signals exhibiting reduced adjacent channel energy, said method comprising the steps of:
   generating I, Q modulation signals wherein a sum of the squares of instantaneous I and Q signals is a constant;
   applying said I, Q signals to a quadrature modulator operating on sine and cosine carrier frequency signals to obtain a constant-envelope signal;
   amplifying said constant envelope signal using a power amplifier designed to yield high efficiency with constant-envelope signals;
   high-pass filtering said I and Q signals and applying said high-pass filtered signals to a second quadrature modulator to obtain an error signal;

amplifying said error signal using a linear amplifier adapted to effectively amplify varying amplitude signals; and adding an output of said power amplifier to an output of said linear amplifier in order to obtain a signal having reduced adjacent channel energy.

10. A method according to claim 9 wherein said I, Q signals represent digital data modulation signals.

11. A method of generating amplified, digital data-modulated signals exhibiting reduced adjacent channel energy, said method comprising the steps of:

generating I, Q modulated signals representing digital data, said signals having greater than desired adjacent channel energy;

applying said I, Q signals to a quadrature modulator operating on sine and cosine carrier frequency signals to obtain a first signal;

high-pass filtering said I, Q modulation signals to obtain high-pass filtered I, Q signals;

applying said high-pass filtered I, Q signals to a second quadrature modulator to obtain a second signal; and amplifying and adding said first and second signals to obtain a signal having reduced adjacent channel energy.

12. A method for generating amplified, digital data modulated to obtain signals reduced adjacent channel energy, said method comprising the steps of:

generating I, Q signals corresponding to a constant-envelope digital data modulation;

applying said I, Q signals to a quadrature modulator operating on sine and cosine carrier frequency signals to obtain a constant-envelope signal;

amplifying said constant envelope signal using a power amplifier designed to yield high efficiency with constant-envelope signals;

high-pass filtering said I, Q signals and applying the resulting high-pass filtered signals to a second quadrature modulator to obtain an error signal;

amplifying said error signal using a linear amplifier adapted to varying amplitude signals; and adding output of said power amplifier to output of said linear amplifier to obtain a signal having reduced adjacent channel energy.

13. A method according to claim 12 further comprising the step of retrievably storing precalculated I, Q signals as values numerically stored in and retrieved from a Read Only Memory.

14. A method of generating amplified, digital data modulated signals to provide reduced adjacent channel energy, said method comprising the steps of:

feeding digital data signals through a shift register of N stages;

coupling N signals from said shift register corresponding to the last N data bits of said digital data signals to address input lines of a read only memory;

connecting address lines of said read only memory to the digit lines of a counter;

incrementing said counter to obtain sequentially a number of sets of four output values from said read only memory;

digital-to-analog converting said four output values to obtain a first I, Q signal and a second I, Q signal;

applying said first I, Q signal to a first quadrature modulator to obtain a first signal of higher than desired adjacent channel energy;

applying said second I, Q signal to a second quadrature modulator to obtain a second signal; and adding said first signal to said second signal in an optimum ratio to obtain a signal of reduced adjacent channel energy.

15. An apparatus for producing amplified signals for communications having reduced adjacent channel energy, said apparatus comprising:

means for generating a first signal having an undesired amount of adjacent channel energy;

means for generating a second signal corresponding to the undesired amount of adjacent channel energy; and means for subtracting said second signal from said first signal to remove said undesired amount of adjacent channel energy.

16. An apparatus according to claim 15 wherein said first signal is a constant-envelope signal.

17. An apparatus according to claim 15 wherein said means for generating said first signal includes a phase modulator for phase modulating a carrier frequency signal.

18. An apparatus according to claim 17 wherein said phase modulator includes a quadrature modulator for quadrature modulation using sine and cosine carrier frequency signals.

19. An apparatus according to claim 15 wherein said means for generating said first signal includes a modulator for modulating a signal with digital data.

20. An apparatus according to claim 15 further comprising a Class-C power amplifier for amplifying said first signal.

21. An apparatus according to claim 15 further comprising a linear amplifier for amplifying said second signal.

22. An apparatus according to claim 15 wherein said means for subtraction includes a directional coupler for combining said first and second signals in a predetermined ratio.

23. An apparatus for producing amplified communications signals with reduced adjacent channel energy, said apparatus comprising:

means for generating I, Q modulation signals wherein a sum of the squares of instantaneous I and Q signals is a constant;

a first quadrature modulator for applying sine and cosine carrier frequency signals to said I, Q signals to obtain a constant-envelope signal;

a power amplifier designed to yield high efficiency with constant-envelope signals for amplifying said constant envelope signal;

a high-pass filter for high-pass filtering said I and Q signals;

a second quadrature modulator for applying sine and cosine carrier frequency signals to said high-pass filtered signals to obtain an error signal;

a linear amplifier adapted to effectively amplify varying amplitude signals for amplifying said error signal; and an adder for adding an output of said power amplifier to an output of said linear amplifier in order to obtain a signal having reduced adjacent channel energy.

24. An apparatus according to claim 23, wherein said power amplifier is a Class-C power amplifier.

25. A device according to claim 23 wherein said I, Q signals represent digital data modulation signals.

26. An apparatus for generating amplified, digital data modulated signals exhibiting with adjacent channel energy, said apparatus comprising:

means for generating I, Q signals representing digital data modulation, said signals having greater than desired adjacent channel energy;

a first quadrature modulator to which said I, Q signals are applied and operating on sine and cosine carrier frequency signals to obtain a first signal;

means for high-pass filtering said I, Q modulation signals to obtain high-pass filtered I, Q signals;

a second quadrature modulator to which said high-pass filtered I, Q signals are applied to obtain a second signal; and an adder for adding said first and second signals to obtain a signal having reduced adjacent channel energy.

27. An apparatus for generating amplified, digital data modulated signals with reduced adjacent channel energy, said apparatus comprising:

means for generating I, Q signals corresponding to a constant-envelope digital data modulation;

a first quadrature modulator to which said I, Q signals are applied and operating on sine and cosine carrier frequency signals to obtain a constant-envelope signal;

a power amplifier designed to yield high efficiency with constant-envelope signals for amplifying said constant envelope signal;

means for high-pass filtering said I, Q signals;

a second quadrature modulator to which said high-pass filtered signals to obtain an error signal;

a linear amplifier adapted to varying amplitude signals for amplifying said error signal; and an adder for adding output of said power amplifier to output of said linear amplifier to obtain a signal having reduced adjacent channel energy.

28. An apparatus according to claim 27 further comprising a memory for retrievably storing precalculated I, Q signals as values numerically stored therein.

29. An apparatus for generating amplified, digital data modulated signals with reduced adjacent channel energy, said apparatus comprising:

a shift register of N stages to which digital data input signals are input;

a read only memory having address input lines to which are coupled to N signals from said shift register corresponding to the last N data bits of said digital data signals;

a counter having digit lines to which are connected to address lines of said read only memory;

means for incrementing said counter to obtain sequentially a number of sets of four output values from said read only memory;

digital-to-analog convertor for converting said four output values to obtain a first I, Q signal and a second I, Q signal;

a first quadrature modulator to which said first I, Q signal is applied to obtain a first signal of higher than desired adjacent channel energy;

a second quadrature modulator to which said second I, Q signal is applied to obtain a second signal; and an adder for adding said first signal to said second signal in an optimum ratio to obtain a signal of reduced adjacent channel energy.

* * * * *

UNITED STATES PATENT AND TRADEMARK OFFICE
CERTIFICATE OF CORRECTION

PATENT NO. : 5,694,433
DATED : December 2, 1997
INVENTOR(S) : Paul W. DENT

It is certified that error appears in the above-indentified patent and that said Letters Patent is hereby corrected as shown below:

Column 5, line 54, delete "skins and the skins per se" and insert therefor --skirts and the skirts per se--.

Signed and Sealed this

Twenty-eighth Day of July, 1998

Attest:

BRUCE LEHMAN

Attesting Officer     Commissioner of Patents and Trademarks